United States Patent
Kihara et al.

(10) Patent No.: US 11,094,551 B2
(45) Date of Patent: Aug. 17, 2021

(54) PLASMA PROCESSING METHOD AND PLASMA PROCESSING APPARATUS

(71) Applicant: TOKYO ELECTRON LIMITED, Tokyo (JP)

(72) Inventors: Yoshihide Kihara, Miyagi (JP); Toru Hisamatsu, Miyagi (JP); Kensuke Taniguchi, Miyagi (JP); Yoshinari Hatazaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/713,945

(22) Filed: Dec. 13, 2019

(65) Prior Publication Data

US 2020/0194274 A1    Jun. 18, 2020

(30) Foreign Application Priority Data

Dec. 14, 2018   (JP) .............................. JP2018-234742

(51) Int. Cl.
*H01L 21/3065* (2006.01)
*H01J 37/32* (2006.01)

(52) U.S. Cl.
CPC .. *H01L 21/30655* (2013.01); *H01J 37/32935* (2013.01); *H01J 2237/3343* (2013.01)

(58) Field of Classification Search
None
See application file for complete search history.

(56) References Cited

U.S. PATENT DOCUMENTS

| | | | |
|---|---|---|---|
| 2008/0182419 A1* | 7/2008 | Yasui | H01L 21/32139 438/710 |
| 2009/0050271 A1* | 2/2009 | Goyal | H01L 21/0338 156/345.25 |
| 2014/0120726 A1* | 5/2014 | Nemani | H01J 37/32009 438/694 |
| 2017/0170313 A1* | 6/2017 | Chan | H01L 29/0669 |
| 2018/0337046 A1* | 11/2018 | Shamma | H01L 21/0338 |
| 2020/0058503 A1* | 2/2020 | Vidyarthi | H01L 21/0337 |

FOREIGN PATENT DOCUMENTS

JP    2015-115410 A    6/2015

* cited by examiner

*Primary Examiner* — Shamim Ahmed
(74) *Attorney, Agent, or Firm* — Rothwell, Figg, Ernst and Manbeck, P.C.

(57) ABSTRACT

A plasma processing method performed using a plasma processing apparatus includes a first step of forming a first film on a pattern formed on a substrate and having dense and coarse areas, and a second step of performing sputtering or etching on the first film.

14 Claims, 8 Drawing Sheets

X<Y shrink

X>Y shrink

X=Y shrink

PLASMA PROCESSING METHOD AND PLASMA PROCESSING APPARATUS

CROSS-REFERENCE TO RELATED APPLICATIONS

This application is based on and claims priority from Japanese Patent Application No. 2018-234742, filed on Dec. 14, 2018 with the Japan Patent Office, the disclosure of which is incorporated herein in its entirety by reference.

TECHNICAL FIELD

The following disclosure relates to a plasma processing method and a plasma processing apparatus.

BACKGROUND

As miniaturization of semiconductor devices has progressed and techniques such as extreme ultraviolet (EUV) lithography have been developed, there is a demand for precise control of a pattern dimension of, for example, a mask formed on a semiconductor substrate.

For example, in order to control the shrinkage ratio in the critical dimension (CD) of an etching pattern, a technique has been proposed in which a mask formed on an etching target film is treated with a treatment gas before etching (see, e.g., Japanese Patent Laid-Open Publication No. 2015-115410).

SUMMARY

A plasma processing method performed using a plasma processing apparatus according to an aspect of the present disclosure includes a first step of forming a first film on an iso-dense pattern formed on a substrate, and a second step of performing sputtering or etching on the first film.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

When a semiconductor device is miniaturized, a plurality of processings are executed until a desired pattern is formed. Then, an inter-pattern deviation may occur between layers formed by respective processings. In order to eliminate the inter-pattern deviation, it is required to control the dimension of a pattern formed on the semiconductor device.

There is a mask pattern having a major axis and a minor axis such as, for example, an elliptical pattern. When such a pattern is formed, the dimension of the major axis is likely to change due to a loading effect in an etching step. Therefore, it is desired to control the major axis and the minor axis independently.

(Regarding X-Y CD Control)

First, X-Y CD control will be described. Critical dimension (CD) is a term that refers to the dimension of a pattern on a semiconductor substrate. The CD is used as a parameter indicating a characteristic of a semiconductor device. When a desired CD is not achieved, the performance of the semiconductor device is affected. For this reason, a plasma processing is required to achieve a desired CD.

There are various shapes for patterns formed in the manufacture of semiconductor devices. For example, as described above, as one of the patterns, there is a pattern having different lengths in two axial directions, such as an elliptical pattern. Hereinafter, the pattern having a difference in dimension in two directions (X direction: minor axis, Y direction: major axis) orthogonal to each other when viewed from above, such as, for example, an elliptical hole, is referred to as an X-Y pattern. Controlling the CD of the X-Y pattern is called X-Y CD control. The X-Y CD control includes, for example, X>Y shrinkage, X<Y shrinkage, and X=Y shrinkage. In the X>Y shrinkage, the opening dimension of an X-Y pattern is reduced (shrinks) such that a change amount ($\Delta X$) in the opening dimension of the short side X is larger than a change amount ($\Delta Y$) in the opening dimension of the long side Y. In the X<Y shrinkage, the opening dimension of an X-Y pattern is reduced such that $\Delta Y$ is larger than $\Delta X$. In the X=Y shrinkage, the opening dimension of an X-Y pattern is reduced such that $\Delta X$ and $\Delta Y$ are equal to each other.

Figure 8:
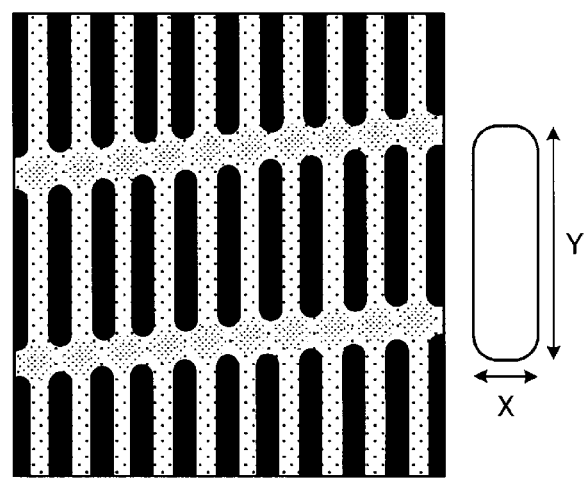
FIG. 8 is a view for explaining an exemplary X-Y pattern.

FIG. 8 is a view for explaining an exemplary X-Y pattern. FIG. 8 is a partial top view of an exemplary mask having an X-Y pattern formed on a substrate. The substrate illustrated in FIG. 8 has a plurality of substantially rectangular (elliptical) openings formed in an aligned state in a top view. The openings have substantially the same dimension.

In the case where there is a deviation between the actual dimension and the design dimension of a mask having an X-Y pattern formed as illustrated in FIG. 8, when etching is performed through the mask as it is, the deviation is transferred to the shape after etching. Therefore, before etching, X-Y CD control is performed, that is, the dimension of an X-Y pattern is controlled.

Figure 9A:
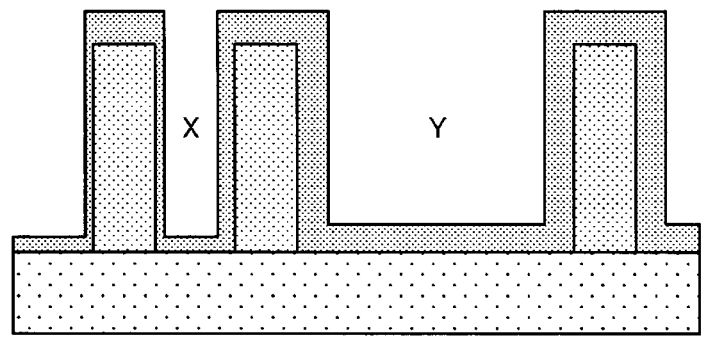
FIG. 9A is a view for explaining Dimension Control Example 1 of an X-Y pattern.
Figure 9B:
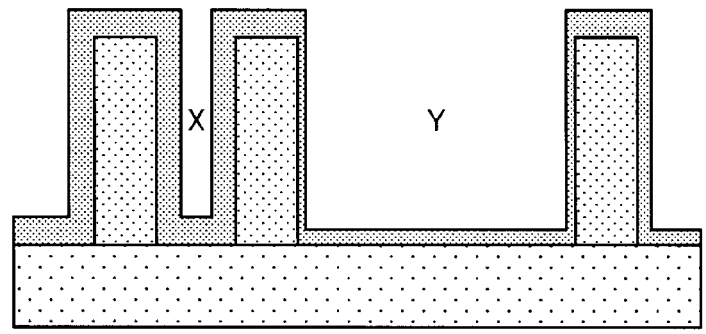
FIG. 9B is a view for explaining Dimension Control Example 2 of an X-Y pattern.
Figure 9C:
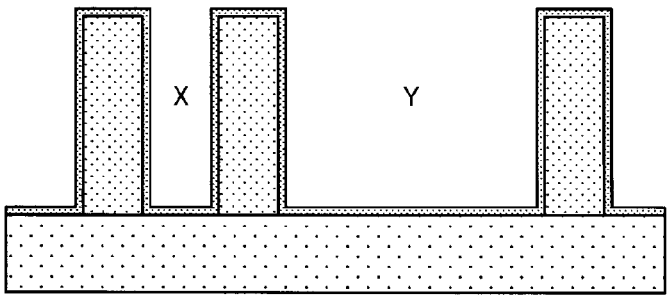
FIG. 9C is a view for explaining Dimension Control Example 3 of an X-Y pattern.

FIG. 9A is a view for explaining Dimension Control Example 1 of an X-Y pattern. FIG. 9B is a view for explaining Dimension Control Example 2 of an X-Y pattern. FIG. 9C is a view for explaining Dimension Control Example 3 of an X-Y pattern. The example of FIG. 9A is a control example that reduces the opening dimension of the long side Y while maintaining the opening dimension of the short side X (X<Y shrinkage: reducing an opening such that the reduction amount of the Y side is larger than that of the X side). In the example of FIG. 9A, after an X-Y pattern is formed, a film is formed on the substrate such that the Y side is reduced. Meanwhile, the example of FIG. 9B is a control example that reduces the opening dimension of the short side X while maintaining the opening dimension of the long side Y (X>Y shrinkage: reducing an opening such that the reduction amount of the Y side is larger than that of the X side). In the example of FIG. 9B, after an X-Y pattern is formed, a film is formed on the substrate such that the X side is reduced. In addition, the example of FIG. 9C is a control example that reduces the opening dimension of the short side X and the opening dimension of the long side Y to substantially the same extent (X=Y shrinkage). In the example of FIG. 9B, after an X-Y pattern is formed, a film is formed on the substrate such that the X side and the Y side are reduced are reduced substantially the same extent.

Figure 10:
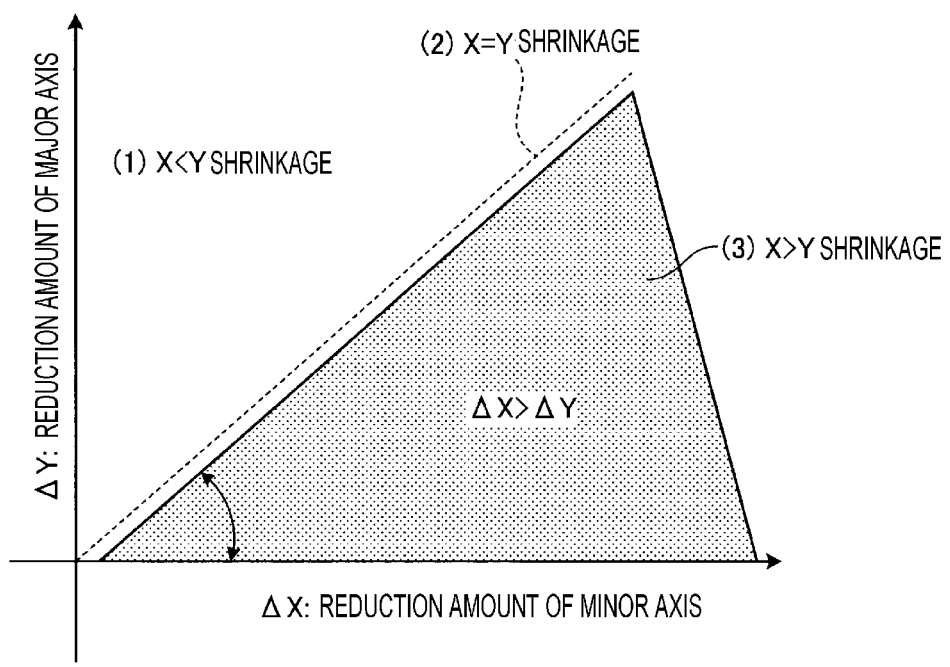
FIG. 10 is a view for explaining dimension control of an X-Y pattern.

FIG. 10 is a view for explaining dimension control of an X-Y pattern. In FIG. 10, the "X<Y shrinkage" of the upper left area ((1) in FIG. 10) may be realized using, for example, the loading effect of chemical vapor deposition (CVD). In addition, the "X=Y shrinkage" of the straight line extending upward to the right in the center ((2) in FIG. 10) may be realized using, for example, atomic layer deposition (ALD). A plasma processing method according to an embodiment to be described below realizes "X>Y shrinkage" in the lower right area ((3) in FIG. 10).

Configuration of Plasma Processing Apparatus According to Embodiment

Figure 1:
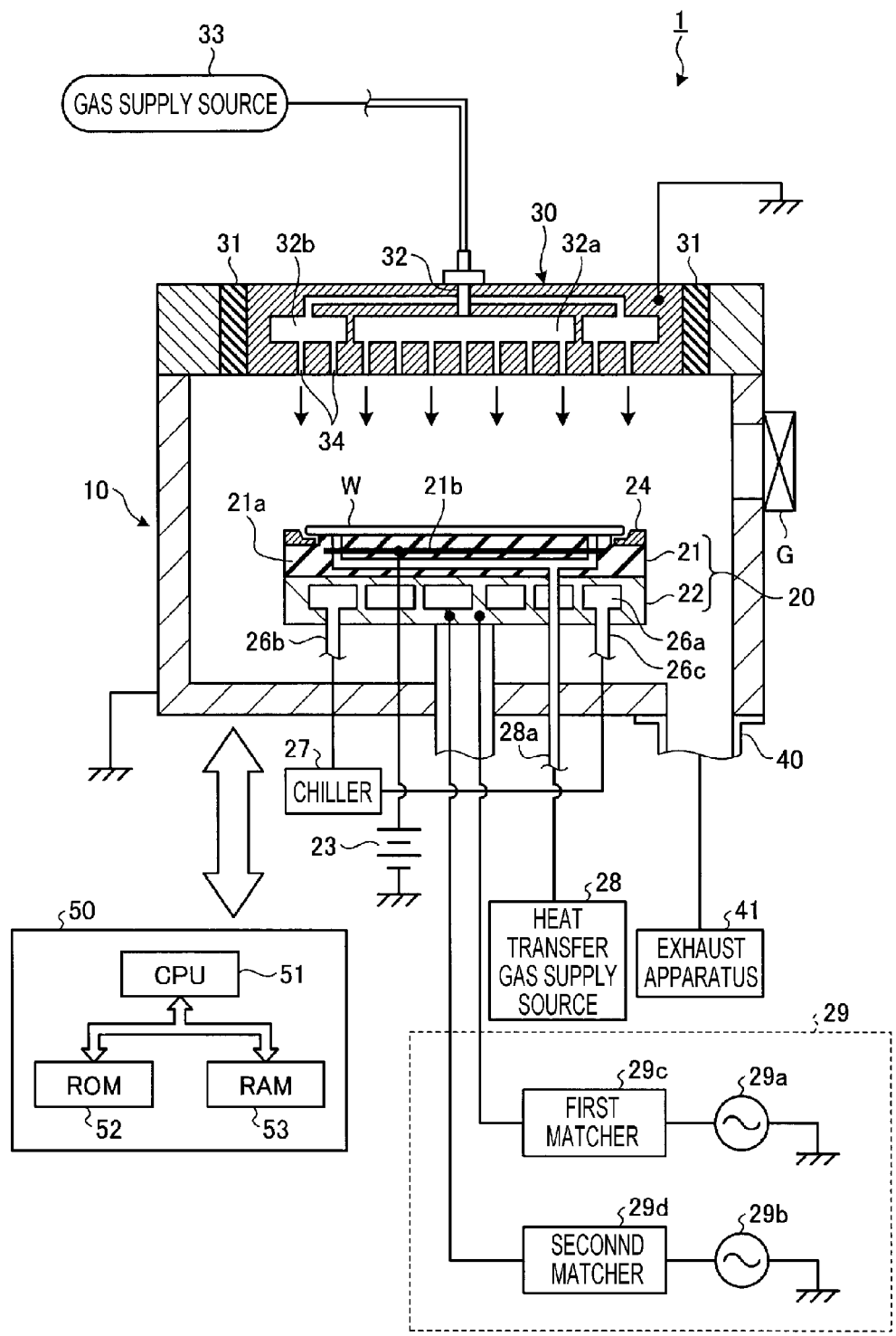
FIG. 1 is a view illustrating an exemplary configuration of a plasma processing apparatus according to an embodiment.

First, a plasma processing apparatus 1 according to an embodiment will be described with reference to FIG. 1. FIG. 1 is a view illustrating an exemplary configuration of a plasma processing apparatus 1 according to an embodiment. In the plasma processing apparatus 1 according to the present embodiment, for example, etching, film formation, or sputtering is executed on a semiconductor wafer. The plasma processing apparatus 1 according to the present embodiment is a parallel flat plate type plasma processing apparatus (capacitively coupled plasma processing apparatus) in which a stage 20 and a gas shower head 30 are disposed inside a chamber 10 to face each other. The stage 20 also functions as a lower electrode, and the gas shower head 30 also functions as an upper electrode.

The plasma processing apparatus 1 has a cylindrical chamber 10 made of, for example, aluminum having a surface subjected to alumite treatment (anodized). The chamber 10 is electrically grounded. A stage 20 configured to place a semiconductor wafer (hereinafter, simply referred to as a "wafer W") thereon is provided on the bottom of the chamber 10. The wafer W is an example of a substrate. The stage 20 includes an electrostatic chuck 21 configured to hold a wafer W by an electrostatic attraction force and a base 22 configured to support the electrostatic chuck 21.

The base 22 is made of, for example, aluminum (Al), titanium (Ti), or silicon carbide (SiC).

On the upper surface of the base 22, an electrostatic chuck 21 is installed in order to electrostatically attract a wafer. The electrostatic chuck 21 has a structure in which a chuck electrode 21b is sandwiched between insulators 21a. A direct current (DC) voltage source 23 is connected to the chuck electrode 21b, and a DC voltage HV is applied from the DC voltage source 23 to the chuck electrode 21b, whereby the wafer W is attracted to the electrostatic chuck 21 by a Coulomb force. On the upper surface of the electrostatic chuck 21, a holding surface configured to hold the wafer W thereon and a peripheral edge portion which is lower than the holding surface are formed. The wafer W is placed on the holding surface of the electrostatic chuck 21.

An edge ring 24 is disposed on the peripheral edge portion of the electrostatic chuck 21 so as to surround the wafer W placed on the placement surface of the stage 21. The edge ring 24 is formed of, for example, silicon or quartz. The edge ring 24 functions to enhance in-plane uniformity of a plasma processing.

In addition, inside the stage 20 (the base 22), a coolant flow path 26a is formed. A coolant inlet pipe 26b and a coolant outlet pipe 26c are connected to the coolant flow path 26a. A cooling medium (hereinafter, also referred to as "coolant") such as, for example, cooling water or brine output from a chiller 27, circulates through the coolant inlet pipe 26b, the coolant flow path 26a, and the coolant outlet pipe 26c. The stage 20 is heat-released and cooled by the coolant.

The heat transfer gas supply source 28 supplies a heat transfer gas such as, for example, helium gas (He) or argon gas (Ar), to the rear surface of the wafer W on the electrostatic chuck 21 through a gas supply line 28a. With such a configuration, the temperature of the electrostatic chuck 21 is controlled by the coolant circulated in the coolant flow path 26a and the heat transfer gas supplied to the rear surface of the wafer W. As a result, it is possible to control the wafer W to a predetermined temperature. The heat transfer gas supply source 28 and the gas supply line 28 are examples of heat transfer gas supply mechanism that supply the heat transfer gas to the rear surface of the wafer W.

To the stage 20, a power supply apparatus 29 configured to supply two-frequency superimposed power is connected. The power supply apparatus 29 includes a first high-frequency power supply 29a configured to supply first high-frequency power of a first frequency (high-frequency power for plasma generation), and a second high-frequency power supply 29b configured to supply second high-frequency power of a second frequency lower than the first frequency (high-frequency power for bias voltage generation). The first high frequency power supply 29a is electrically connected to the stage 20 via a first matcher 29c. The second high-frequency power supply 29b is electrically connected to the stage 20 via a second matcher 29d. The first high-frequency power supply 29a applies, for example, first high-frequency power of 40 MHz to the stage 20. The second high-frequency power supply 29b applies, for example, second high-frequency power of 400 kHz to the stage 20. Meanwhile, in the present embodiment, the first high-frequency power is applied to the stage 20, but may be applied to the gas shower head 30.

The first matcher 29c matches a load impedance to the internal (or output) impedance of the first high-frequency power supply 29a. The second matcher 29d matches a load impedance to the internal (or output) impedance of the second high-frequency power supply 29b. The first matcher 29c functions such that the internal impedance of the first high-frequency power supply 29a apparently coincides with the load impedance when plasma is generated in the chamber 10. The second matcher 29d functions such that the internal impedance of the second high-frequency power supply 29b apparently coincides with the load impedance when plasma is generated in the chamber 10.

The gas shower head 30 is attached so as to close the opening in the ceiling portion of the chamber 10 via a shield ring 31 that covers the peripheral edge portion of the gas shower head 25. The gas shower head 30 may be electrically grounded as illustrated in FIG. 1.

A gas introduction port 32 for introducing a gas is formed in the gas shower head 30. Inside the gas shower head 30, a center diffusion chamber 32a and an edge diffusion chamber 32b are branched from the gas introduction port 32. The gas output from the gas supply source 33 is supplied to the diffusion chambers 32a and 32b through the gas introduction port 32, diffused in the diffusion chambers 32a and 32b, and introduced from a large number of gas supply holes 34 toward the stage 20.

An exhaust port 40 is formed in the bottom of the chamber 10, and the inside of the chamber 10 is evacuated by an exhaust apparatus 41 connected to the exhaust port 40. This makes it possible to maintain the inside of the chamber 10 at a predetermined degree of vacuum. On the side wall of the chamber 10, a gate valve G is provided. The gate valve G opens/closes a loading/unloading port when a wafer W is loaded/unloaded into/from the chamber 10.

The plasma processing apparatus 1 is provided with a controller 50 configured to control the operations of the entire apparatus. The controller 50 includes a central processing unit (CPU) 51, read only memory (ROM) 52, and random access memory (RAM) 53. According to various recipes stored in these storage areas, the CPU 51 executes a desired processing such as, for example, a plasma processing to be described later. The recipes include, for example, process time, pressure (gas evacuation), high-frequency power and voltage, various gas flow rates, temperature in the chamber (upper electrode temperature, side wall temperature of the chamber, or wafer W temperature (electrostatic chuck temperature)), and the temperature of coolant output from the chiller 27. Meanwhile, recipes representing these programs and processing conditions may be stored in a hard disk or semiconductor memory. In addition, the recipes may be set in or read from a predetermined position in the state of being stored in a storage medium readable by a portable computer such as, for example, a CD-ROM and a DVD.

For example, the controller 50 controls each unit of the plasma processing apparatus 1 so as to perform a plasma processing method to be described later.

Plasma Processing Method According to Embodiment

Figure 2:
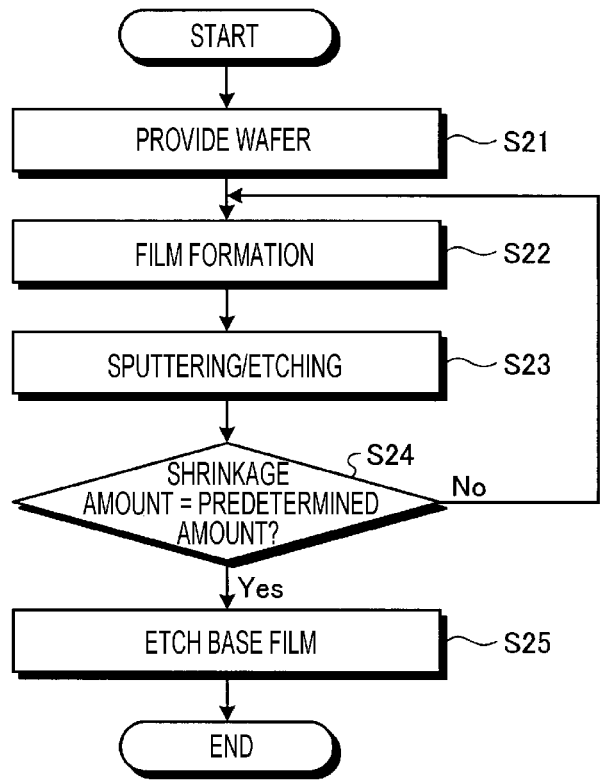
FIG. 2 is a schematic flowchart illustrating an exemplary flow of a plasma processing according to an embodiment.
Figure 3A:
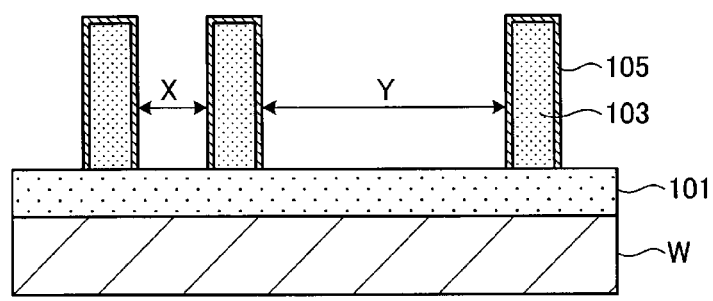
FIG. 3A is a schematic cross-sectional view illustrating a wafer having a mask pattern formed thereon.
Figure 3B:
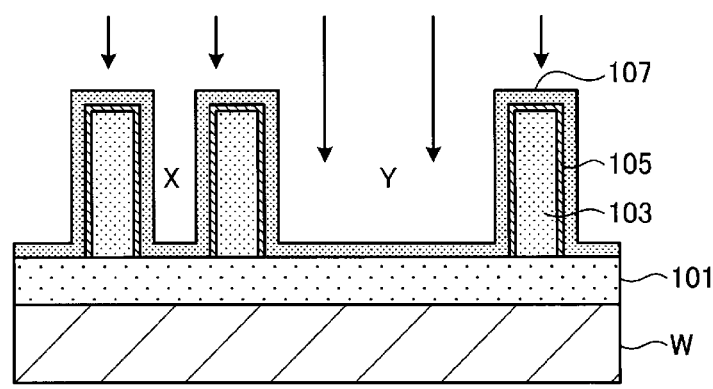
FIG. 3B is a schematic cross-sectional view of a wafer after a film forming processing according to an embodiment.
Figure 3C:
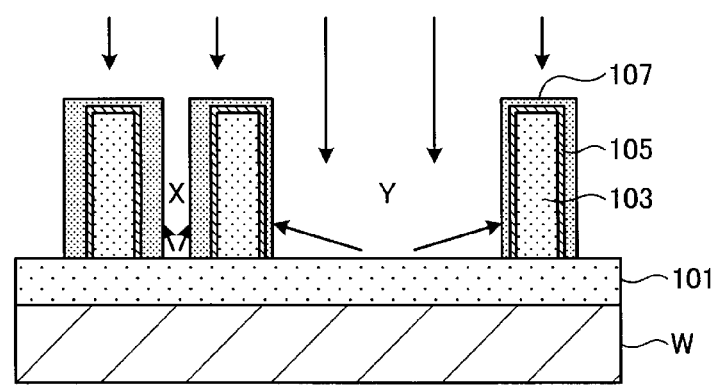
FIG. 3C is a schematic cross-sectional view of a wafer after a sputtering or etching according to an embodiment.

FIG. 2 is a schematic flowchart illustrating an exemplary flow of a plasma processing according to an embodiment. FIG. 3A is a schematic cross-sectional view illustrating a wafer having a mask pattern formed thereon. FIG. 3B is a schematic cross-sectional view of a wafer after a film forming processing according to an embodiment. FIG. 3C is a schematic cross-sectional view of a wafer after a sputtering or etching according to an embodiment.

First, a wafer W to be processed is provided (step S21) (see, e.g., FIG. 3A). A base film 101 to be etched is formed on the wafer W. A photoresist mask pattern 103 is formed on the base film 101 through EUV lithography or ArF lithography. The mask pattern 103 includes the X-Y pattern. In addition, a coating 105 is applied to the mask pattern 103. The coating 105 may include silicon. The coating 105, which is a protective film that increases the resistance of the mask pattern 103, may be omitted.

Next, the controller 50 of the plasma processing apparatus 1 controls each unit of the plasma processing apparatus 1 to perform a film forming processing on the wafer W (step S22, FIG. 3B). A first film 107 is formed on the mask pattern 103 of the wafer W by the film forming processing. For example, the film forming processing in step S22 is performed through CVD using a fluorocarbon ($C_xF_y$)-based processing gas. Hereinafter, the film forming processing for forming the first film 107 in step S22 is also referred to as a first step.

Next, the controller 50 performs sputtering (or etching) on the first film 107 formed in step S22 (step S23, FIG. 3C). For example, the controller 50 generates plasma, applies an RF bias voltage to the stage 20 (lower electrode), and causes ions of a rare gas such as argon (Ar) gas to collide toward the first film 107. Particles ejected from the first film 107 (e.g., $C_xF_y$ atoms or molecules) are attached and deposited to the surrounding pattern again. At this time, the particles of a film forming material ejected from the first film 107 are difficult to be discharged to the outside of the hole in the short side X, and the amount attached to the side wall of the short side X increases. Meanwhile, in the long side Y, the film-forming material generated by sputtering is easily discharged to the outside of the hole, and thus the number of particles attached to the side wall of the long side Y is smaller than that of the short side X. For this reason, the combination of film formation in step S22 and sputtering (or etching) in step S23 realizes X>Y shrinkage. Hereinafter, the sputtering (etching) in step S23 is also referred to as a second step.

Next, the controller 50 determines whether or not the shrinkage amount ($\Delta X$, $\Delta Y$) of the mask pattern 103 has reached a predetermined amount (step S24). For example, when the number of executions of step S22 and step S23 reaches a predetermined number, the controller 50 determines that the shrinkage amount has reached a predetermined amount. When it is determined that the shrinkage amount has not reached the predetermined amount (step S24, No), the controller 50 returns to step S22 and repeats film formation and sputtering. Meanwhile, when it is determined that the shrinkage amount has reached the predetermined amount (step S24, Yes), the controller 50 performs etching of a base film 101 formed under the mask pattern 103 (step S25). Thus, a pattern is formed on the base film 101. With this, the plasma processing according to an embodiment is terminated. Meanwhile, in step S24, instead of or in addition to determining whether the shrinkage amount of the mask pattern 103 has reached the predetermined amount, the CD value of the mask pattern 103 after film formation in step S22 may be measured. The measurement of the CD value may be performed using an optical method after film formation. Then, it may be determined that the shrinkage amount has reached the predetermined amount depending on whether or not the CD value has reached a predetermined value.

Effect of X>Y Shrinkage According to Embodiment

Figure 4:
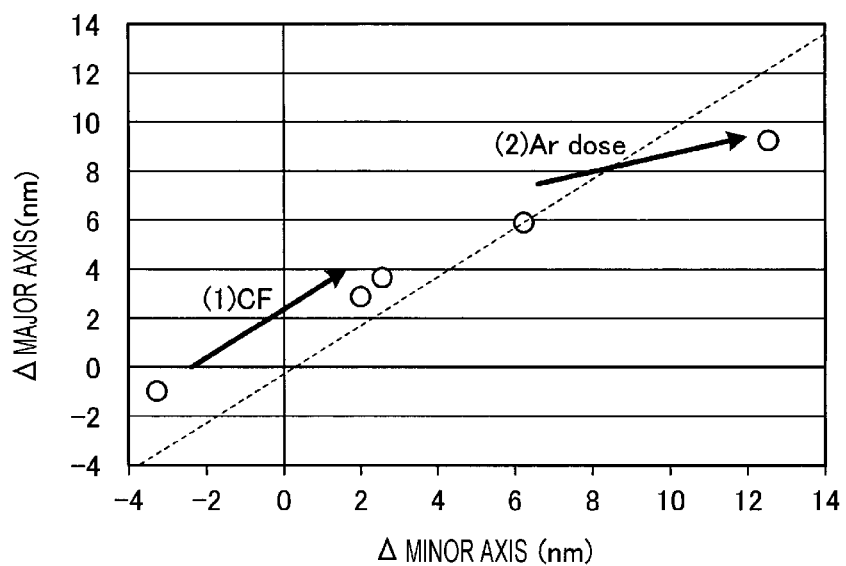
FIG. 4 is a view for explaining changes in a major axis Y and a minor axis X in X>Y CD control according to an embodiment.
Figure 5:
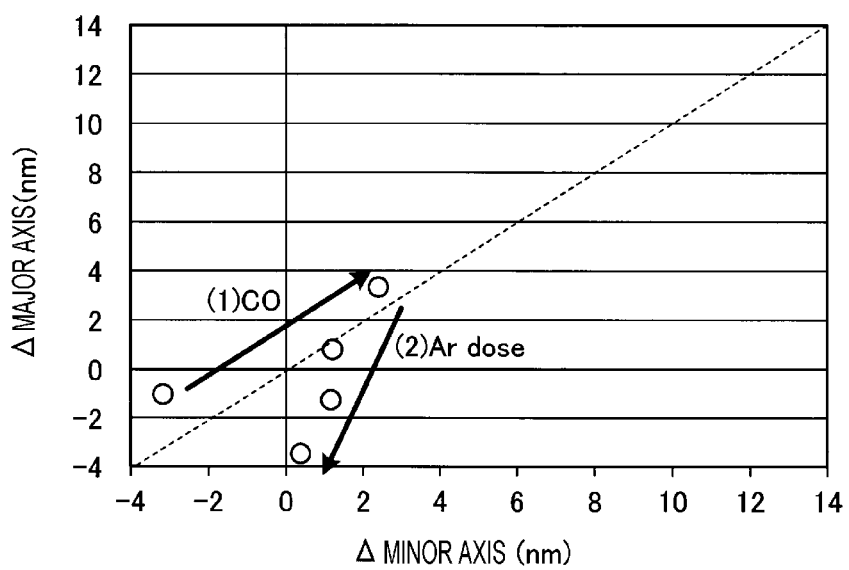
FIG. 5 is another view for explaining changes in a major axis Y and a minor axis X in X>Y CD control according to an embodiment.

FIG. 4 is a view for explaining changes in a major axis Y and a minor axis X in X>Y CD control according to an embodiment. FIG. 5 is another view for explaining changes in a major axis Y and a minor axis X in X>Y CD control according to an embodiment.

In the example of FIG. 4, on a wafer W having an X-Y pattern, CVD was performed using octafluorocyclobutane ($C_4F_8$) and argon (Ar), and then sputtering was performed using argon gas. As represented in FIG. 4, during the CVD, a film is formed in both the minor axis (X side) and the major axis (Y side), and shrinks ((1) in FIG. 4). In addition, during the CVD, the shrinkage amount is slightly larger on the major axis side than on the minor axis side due to the loading effect. Thereafter, when sputtering is performed, transition is made to X>Y shrinkage ((2) in FIG. 4). According to this processing, it is possible to increase ΔX while suppressing ΔY, thereby causing the minor axis (X side) to shrink. As described above, in the processing according to the embodiment, it is possible to cause the CD to shrink in the minor axis direction by selectively attaching the film forming material to the minor axis side.

In the example of FIG. 5, CVD was performed using carbon monoxide (CO) and argon, and then sputtering was performed using argon gas. In the example of FIG. 5 as well, during the CVD, a film is formed in both the minor axis and the major axis, and shrinkage proceeds ((1) in FIG. 5). Thereafter, transition is made to X>Y shrinkage by sputtering ((2) in FIG. 5), and the shrinkage does not proceed on the major axis side, but proceeds on the minor axis side. That is, the shrinkage on the major axis side is maintained while trimming the major axis side through sputtering. It is possible to independently suppress ΔY. In this processing, the shrinkage amount of ΔX is suppressed since the carbon-based thin film formed in (1) functions as a protective film in sputtering. Meanwhile, trimming is realized on the major axis side by the loading effect of sputtering. Thus, by combining film formation and sputtering, it is possible to realize X>Y shrinkage of the X-Y pattern.

(Additional Step)

Figure 6:
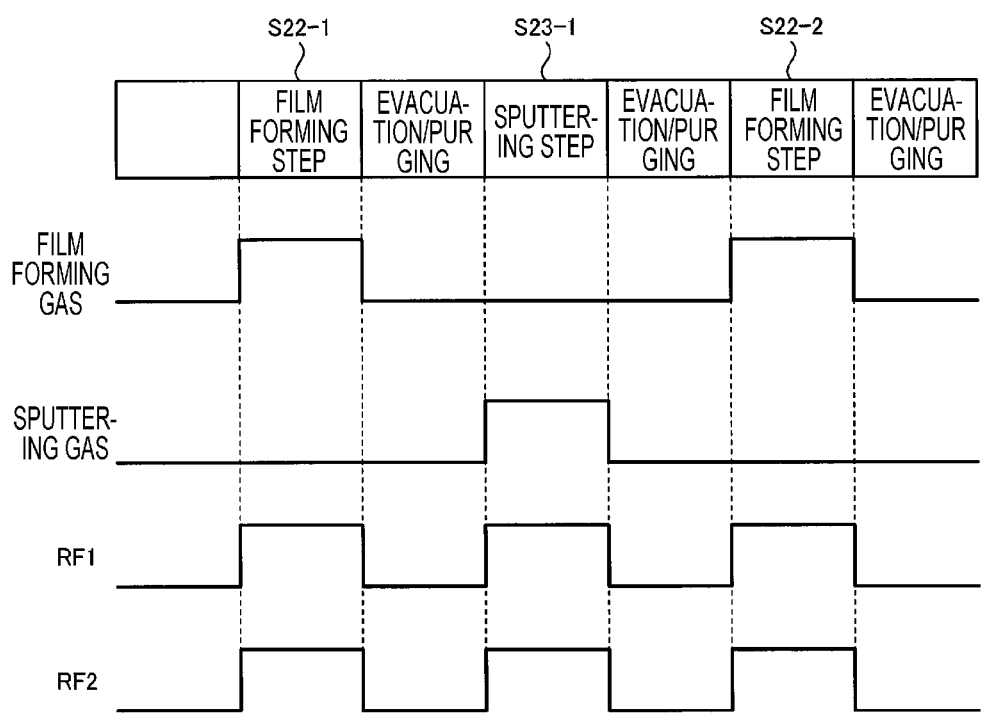
FIG. 6 is a view for explaining an exemplary additional step of a plasma processing according to an embodiment.

Meanwhile, in the plasma processing method, when the first step (film forming step) and the second step (sputtering or etching) are performed cyclically, additional steps such as, for example, an evacuating step and a purging (gas exchange) step may be included at a gas switching timing. The additional steps are, for example, steps for preventing the gas used in the first step and the gas used in the second step from being mixed in the chamber. FIG. 6 is a view for explaining exemplary additional steps of a plasma processing according to an embodiment.

In the example of FIG. 6, the plasma processing method includes additional steps when transiting from a film forming step (S22-1) to a sputtering step (S23-1) and when transiting from the sputtering (S23-1) to a film forming step (S22-2). For example, the additional steps are performed when the supply of a film forming gas and a sputtering gas and the application of first high-frequency power RF1 (see, e.g., 29a in FIG. 1) and second high-frequency power RF2 (see, e.g., 29b in FIG. 1) are stopped.

In the above-described embodiment, it has been described that a base film 101, a mask pattern 103, and a coating 105 are formed on the wafer W.

The base film 101 may include, for example, a titanium nitride (TiN) film, a silicon oxide film, a polysilicon film, an organic film, and an antireflection film (e.g., Si-ARC). For example, a titanium nitride film is deposited on a wafer W through sputtering. Next, a silicon oxide film is deposited through plasma CVD using, for example, tetraethoxy silane (TEOS) as a raw material. Next, a polysilicon film is deposited through plasma CVD. Then, an organic film is formed using a spin-on material. Furthermore, an antireflection film is formed on the organic film.

In addition, a mask pattern 103 is formed on the antireflection film. The mask pattern 103 of a photoresist film is formed on the antireflection film using, for example, EUV lithography.

However, the base film 101 to be etched in the above embodiment is not limited to the above configuration, and may be a silicon-containing film. For example, silicon oxide, silicon nitride, polysilicon, metal silicide, or single crystal silicon may be used as the silicon-containing film. On the wafer W, other material films such as, for example, a conductive film, an insulating film, an antireflection film, and a diffusion film may be included.

(Determination of Processing Condition Using Multiple-Regression Equation)

In the present embodiment, the processing conditions for the film forming processing (step S22) and sputtering (step S23) are also determined in accordance with a desired shrinkage amount. For example, in the plasma processing apparatus 1 according to an embodiment, explanatory variables that affect achievement of desired shrinkage through multiple-regression analysis are determined, and a multiple regression curve is set. Then, in the plasma processing apparatus 1, the processing conditions of each processing are determined using the set multiple-regression curve, and the film-forming processing and sputtering are executed with the determined processing conditions.

In an embodiment, the following Equation (1) is used as a multiple-regression curve for a X>Y control of the mask pattern 103.

$$\Delta X = a\alpha + b\beta + c \tag{1}$$

In Equation (1), ΔX is the shrinkage amount of the minor axis (X), aα is a processing condition of a film forming processing (step S22), for example, the processing time, bβ, is a process condition of sputtering (step S23), and for example, a processing time, c, is an intercept.

Equation (1) was derived by executing multiple-regression analysis using, for example, ΔX, ΔY, ΔY−ΔX, and a X/Y ratio, as objective variables and using processing conditions of each processing as explanatory variables. As explanatory variables, for example, a processing gas flow rate, a processing time, and an applied voltage value in a film forming processing and sputtering were used. As a result, the processing time for each of the film forming processing and sputtering was specified as a variable having a large influence on the shrinkage amount of CD.

Figure 7:
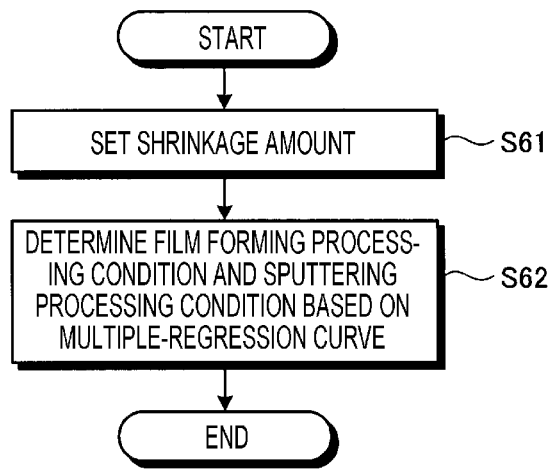
FIG. 7 is a flowchart illustrating an exemplary flow of a processing condition determination processing according to an embodiment.

FIG. 7 is a flowchart illustrating an exemplary flow of a processing condition determination processing according to an embodiment. First, a desired shrinkage amount (e.g., ΔX) is set for the mask pattern 103 formed on the wafer W (step S61). For example, the desired shrinkage amount is determined based on, for example, inspection using light after the mask pattern 103 is formed on the wafer W in step S21 of FIG. 2. The shrinkage amount may be set in advance based on past data, or may be determined for each wafer to be processed.

Next, the shrinkage amount set in step S61 is substituted into Equation (1) of the multiple-regression curve. Then, processing conditions for the film forming processing (step S22, first step) and sputtering (step S23, second step) are determined based on Equation (1) (step S62). In Equation (1), the aα term and the bβ term are the processing time of the film forming processing and the processing time of the sputtering, respectively. Therefore, the processing time of each processing is determined here. With this, the processing condition determination processing is terminated.

The multiple-regression curve is calculated in advance based on the data of wafers W processed in the past and stored in the controller 50. Alternatively, the data of the wafers W processed by the plasma processing apparatus 1 may be stored in the controller 50, and the multiple-regression analysis may be periodically re-executed to update the multiple-regression curve. In addition, in the plasma processing apparatus 1, data of a wafer W under processing, for example, a CD may be acquired in real time, and the processing conditions of the processing performed on the wafer W may be corrected.

In addition, in the plasma processing apparatus 1, not only the processing conditions of the film forming processing (step S22) and the sputtering (step S23) but also the processing conditions of etching (step S25) may be determined using a multiple-regression curve. For example, instead of Equation (1), a multiple-regression curve having etching processing conditions as explanatory variables is calculated. Then, in the plasma processing apparatus 1, the etching processing conditions are determined using the calculated multiple-regression curve.

In addition, although Equation (1) is a multiple-regression curve for determining each processing time based on $\Delta X$, a multiple-regression curve may be set using, for example, $\Delta Y$ and $\Delta X - \Delta Y$ as objective variables.

Effect of Embodiment

The plasma processing method according the above-described embodiment includes a first step and a second step. In the first step, in a plasma processing apparatus, a first film is formed on an iso-dense pattern formed on a substrate. In the second step, in the plasma processing apparatus, sputtering or etching is performed on the first film. In the plasma processing method according to the embodiment, it is possible to realize X>Y shrinkage, for example, by attaching the first film formed in the first step to a surrounding pattern by the second step.

According to the plasma processing method according to the embodiment, the first step and the second step are repeatedly performed a predetermined number of times in the plasma processing apparatus. For this reason, it is possible to achieve a desired shrinkage amount by repeating each of the first step and the second step two or more times even when the desired shrinkage amount is not achieved even though the first step and the step is performed once.

In addition, the plasma processing apparatus according to the embodiment further includes an evacuating step or a gas exchange step between the first step and the second step. For this reason, in the plasma processing method according to the embodiment, it is possible to prevent the gas used in the first step and the gas used in the second step from being mixed in the chamber.

According to the plasma processing method according to the embodiment, the gas used in the first step contains C, H, F, O, S, or N. For example, the gas used in the first step includes a liquid sample and a gas composed of $C_xH_y$, $C_xF_y$, $C_xO_y$, $C_xH_yF_z$, $C_xH_yO_z$, $C_xH_yN_z$, $C_xH_yS_z$, $C_wH_xF_yO_z$, $C_wH_xN_yO_z$, or $C_wH_xS_yO_z$. In addition, the gas used in the second step is a rare gas, an inert gas, or a combination thereof.

In addition, the plasma processing apparatus according to the embodiment further includes a step of forming the pattern through extreme ultraviolet light (EUV) or ArF lithography. Even when a fine pattern is formed through, for example, the EUV lithography, according to the plasma processing method according to the embodiment, it is possible to easily realize X>Y shrinkage.

In the plasma processing method according to the embodiment, a combination of the first step and the second step reduces an arrangement interval in a portion in which patterns included in the pattern are tightly arranged to a variation amount larger than that of an arrangement interval in a portion in which the patterns are loosely arranged. That is, the plasma processing method according to the embodiment realizes X>Y shrinkage. In addition, the plasma processing method according to the embodiment reduces an arrangement interval in a portion in which the pattern is tightly arranged to a variation amount larger than that of an arrangement interval in a portion in which the pattern is loosely arranged, regardless the shape of the pattern. For this reason, according to the embodiment, it is possible to control irregularity of various patterns, such as, for example, line and space and pattern roughness.

In addition, the plasma processing method according to the embodiment further includes a determination step of determining processing conditions of the first step and the second step based on a multiple-regression curve set using a variation amount set as an objective variable and using the processing conditions of the first step and the second step as explanatory variables. In addition, in the plasma processing method according to the embodiment, the determination step determines the processing times of the first step and the second step. For this reason, according to the embodiment, it is possible to determine the conditions of each step in accordance with a target shrinkage amount, and to efficiently perform dimension control.

In addition, the plasma processing method according to the embodiment further includes a step of performing etching through the pattern. For this reason, according to the embodiment, in the plasma processing apparatus, it is possible to perform etching using the mask after an X-Y CD control is performed, and to manufacture a semiconductor device with high precision.

In addition, the plasma processing method according to the embodiment further includes a second determination step of determining processing conditions of the etching based on a multiple-regression curve. For this reason, according to the embodiment, it is possible to efficiently determine not only the first step and the second step, but also the processing conditions of the etching step based on multiple-regression analysis.

In addition, a plasma processing method according to the embodiment includes a step of providing a substrate including a pattern having an isolated area and a dense area, a film forming step of forming a first film on the pattern. In addition, the plasma processing method according to the embodiment further includes a step of increasing a CD reduction amount in the dense area to be greater than a CD reduction amount in the isolated area by performing sputtering on the first film and reattaching sputtered particles on a sidewall of the pattern. For this reason, according to the embodiment, it is possible to realize X>Y shrinkage by a combination of film formation and sputtering.

(Modification)

Meanwhile, in the embodiment described above, the X-Y pattern has been described using a pattern in which a plurality of elliptical holes having substantially the same dimension are formed. However, without being limited thereto, the present embodiment is applicable to patterns having an iso-dense structure other than the elliptical shape. The iso-dense pattern, for example, a pattern having a portion in which patterns of the same dimension in design are formed loosely and a portion patterns of the same dimension in design are formed tightly. In the case of an X-Y pattern having a plurality of elliptical holes, the minor axis direction of the ellipses is a tightly formed portion and the major axis direction is a loosely formed portion. The plasma processing method of the present embodiment is applicable to, for example, a line and space (L/S) dimension control and roughness improvement.

The multiple-regression analysis may be performed using machine learning. For example, when the CD value of a wafer W, target $\Delta X$, $\Delta Y$, processing conditions (e.g., a processing gas and an applied voltage) are input, machine learning is performed such that the processing time of each of steps (film formation, sputtering, or etching) is output. Moreover, the multiple-regression curve to be applied may be made to be changeable depending on consumption of a plasma processing apparatus. In the multiple-regression analysis, parameters other than those described above may be adopted as explanatory variables. For example, the material gas of a film to be formed and a dose amount in sputtering may be used as explanatory variables.

Meanwhile, in the above-described embodiment, a plasma processing apparatus 1 using capacitively coupled plasma (CCP) as a plasma source has been described as an example. However, the technique disclosed herein is not limited thereto, and a plasma processing apparatus using an arbitrary plasma source such as, for example, inductively coupled plasma (ICP) or microwave plasma may be adopted.

The silicon (Si)-based coating 105 applied on the mask pattern 103 may be implemented using, for example, direct current sputtering or direct current superposition (DCS). For example, the DCS may be performed by the technique described in FIGS. 4A and 4B of US Patent Application Publication No. 2018/0151333.

In addition, depending on the shape and function of the plasma processing apparatus, each processing of FIG. 2 may be performed in a chamber of a single plasma processing apparatus, and a wafer W may be loaded/unloaded between chambers. In the present embodiment, the film forming processing (step S22), the sputtering (step S23), and the etching (step S25) are performed in the chamber 10 of the same plasma processing apparatus 1. In addition, the plasma processing apparatus 1 may be configured such that the processing of applying the coating 105 on the wafer W is also performed in the same chamber 10.

In the above description, the processing gas used in the film forming process (step S22) in FIG. 2 is a fluorocarbon $(C_xF_y)$-based gas. However, the present disclosure is not limited thereto, and the processing gas may be a gas containing carbon, and may contain a material that is released from the pattern surface by the sputtering in step S23 and reattached and deposited on the pattern. For example, a processing gas containing C, H, F, O, S, or N may be used in the film forming processing. For example, a liquid sample and a gas composed of $C_xH_y$, $C_xF_y$, $C_xO_y$, $C_xH_yF_z$, $C_xH_yO_z$, $C_xH_yN_z$, $C_xH_yS_z$, $C_wH_xF_yO_z$, $C_wH_xN_yO_z$, or $C_wH_xS_yO_z$ may be used in the film forming processing.

In the plasma processing according to the above-described embodiment, the film forming and other processings may be further performed after step S25.

According to the present disclosure, it is possible to precisely control the dimension of a pattern formed on a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   forming a first film on a mask having an iso-dense pattern formed on a substrate, the iso-dense pattern having pattern walls forming a dense area and an isolated area; and
   performing sputtering or etching on the first film,
   wherein a combination of the forming and the sputtering or etching reduces a first interval between the pattern walls of the mask in the dense area by a first amount and reduces a second interval between pattern walls of the mask in the isolated area by a second amount, and
   wherein the first amount is larger than the second amount.

2. The method according to claim 1, wherein the forming the first film and the performing sputtering or etching are repeatedly performed a predetermined number of times.

3. The method according to claim 1, further comprising: evacuating or gas-exchanging between the forming the first film and the performing sputtering or etching.

4. The method according to claim 1, wherein a gas used in the forming the first film contains C, H, F, O, S, or N.

5. The method according to claim 1, wherein a gas used in the performing sputtering or etching is a rare gas, an inert gas, or a combination thereof.

6. The method according to claim 1, further comprising: forming the iso-dense pattern through extreme ultraviolet light (EUV) lithography or ArF lithography.

7. The method according to claim 1, further comprising: determining processing conditions of the forming the first film and the performing sputtering or etching based on a multiple-regression curve set using a variation amount as an objective variable and using the processing conditions of the forming the first film and the performing sputtering or etching as explanatory variables.

8. The method according to claim 7, wherein, in the determining the processing conditions, a processing time of the forming the first film and a processing time of the performing sputtering or etching are determined.

9. The method according to claim 1, further comprising: performing etching through the iso-dense pattern after the combination of the forming and the sputtering and with the etching performed with the first interval reduced by the first amount and the second interval reduced by the second amount.

10. The method according to claim 9, further comprising: determining a processing condition of the etching based on a multiple-regression curve.

11. A plasma processing method comprising:
    providing a substrate including a pattern having an isolated area and a dense area;
    forming a first film on the pattern by a plasma CVD; and
    sputtering the first film and reattaching sputtered particles on a sidewall of the pattern to increase a CD reduction amount in the dense area to be greater than a CD reduction amount in the isolated area.

12. The method according to claim 11, wherein the first film includes carbon.

13. The method according to claim 12, wherein the forming of the first film includes forming fluoro-carbon gas into plasma, and wherein the sputtering of the first film includes forming rare gas or inert gas into plasma.

14. The method according to claim 11, further comprising repeating the forming of the first film, the sputtering the first film, and the reattaching sputtered particles until a CD reduction amount of the pattern has reached a predetermined amount.

* * * * *